United States Patent
Gupta et al.

(10) Patent No.: US 9,571,118 B1
(45) Date of Patent: Feb. 14, 2017

(54) PRE-CHARGE BUFFER FOR ANALOG-TO-DIGITAL CONVERTER

(71) Applicant: FREESCALE SEMICONDUCTOR, INC., Austin, TX (US)

(72) Inventors: Sunny Gupta, Noida (IN); Snehal J. Rathi, Noida (IN); Sriram Balamurali, New Delhi (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 15/193,111

(22) Filed: Jun. 27, 2016

(51) Int. Cl.
| | |
|---|---|
| *H03M 1/00* | (2006.01) |
| *H03M 1/12* | (2006.01) |
| *H03K 19/017* | (2006.01) |
| *H03F 3/16* | (2006.01) |
| *H04L 12/931* | (2013.01) |

(52) U.S. Cl.
CPC ..... *H03M 1/1245* (2013.01); *H03K 19/01714* (2013.01); *H03F 3/16* (2013.01); *H04L 49/405* (2013.01)

(58) Field of Classification Search
CPC ............... H03K 19/01714; H03K 19/01735; H03K 19/018521; H03F 3/16; H03F 3/20; H03F 3/45; H04L 49/405; H03M 1/12; H03M 1/1245
USPC ... 327/333, 374, 382, 544; 370/537; 326/17, 326/83, 33, 68; 341/118, 122
See application file for complete search history.

(56) References Cited

U.S. PATENT DOCUMENTS

| | | | | |
|---|---|---|---|---|
| 5,134,316 A | * | 7/1992 | Ta | G11C 7/1051 326/33 |
| 5,491,428 A | * | 2/1996 | Pan | H03K 19/01735 326/17 |
| 7,420,490 B2 | | 9/2008 | Gupta et al. | |
| 7,466,746 B2 | | 12/2008 | Gupta | |
| 7,834,667 B1 | * | 11/2010 | Wong | H03K 19/00315 326/26 |
| 8,514,006 B2 | * | 8/2013 | Cooney | H03K 19/01714 327/108 |
| 9,300,257 B1 | * | 3/2016 | Kulkarni | H03F 3/45183 |
| 2008/0180136 A1 | | 7/2008 | Wu et al. | |

(Continued)

OTHER PUBLICATIONS

Huseyin Dinc, Sean Chuang, Phillip E. Allen, and Paul Hasler, A Rail to Rail, Slew-Boosted Pre-Charge Buffer, 2006 IEEE international Symposium on Circuits and Systems, May 21-24, 2006.

*Primary Examiner* — Lam T Mai
(74) *Attorney, Agent, or Firm* — Charles E. Bergere

(57) ABSTRACT

A pre-charge buffer for sampling input signals and generating a sampled output signal includes a coarse sampling circuit, a fine sampling circuit, and a sample and hold circuit. The coarse sampling circuit pre-samples the input signals during hold phases and for a first predetermined time interval during sample phases of the corresponding sample and hold cycles, and generates a first output signal. The fine sampling circuit samples the input signals during sample phases and generates a second output signal. The sample and hold circuit receives the first and second output signals, and generates a sampled output signal. The coarse sampling circuit provides the first output signal for a predefined time interval during the sample phases to reduce the effect of charge injection and charge sharing. The system uses bottom plate sampling to reduce charge injection caused by switches in the coarse sampling circuit.

13 Claims, 2 Drawing Sheets

(56) References Cited

U.S. PATENT DOCUMENTS

2014/0070976 A1    3/2014  Hurrell et al.
2014/0079079 A1*   3/2014  Mora Puchalt ....... H04L 49/405
                                                      370/537

* cited by examiner

PRE-CHARGE BUFFER FOR ANALOG-TO-DIGITAL CONVERTER

BACKGROUND

The present invention relates generally to analog to digital converters (ADC), and, more particularly, to a pre-charge buffer for an ADC that pre-samples input signals.

Sampler circuits are widely used to sample input signals in signal processing applications such as in ADCs and digital-to-analog converters (DACs). A sampler circuit samples an input signal during a sample phase of a sample and hold cycle and holds the input signal during a hold phase of the sample and hold cycle.

Typically, the sampler circuit is used with an ADC to sample multiple input signals (i.e., channels). The sampler circuit includes multiple input channels for receiving the input signals, multiple input switches, and a sample and hold circuit. The sample and hold circuit is connected to the input channels by way of the input switches. The sample and hold circuit includes a sampling capacitor and a sampling switch. The sampling switch provides the input signals to the sampling capacitor when one of the corresponding input switches is active.

During the sample phase, the sampling capacitor receives an input signal via a corresponding input switch. The sampling capacitor is charged to a voltage level of the input signal, thereby sampling the input signal. During the hold phase, the sampling capacitor holds the input signal and provides it as a sampled output signal to the ADC, which then generates a corresponding digital sampled output signal.

In applications such as adaptive backlight illumination and battery voltage monitoring, which use the sampler circuit along with the ADC, the time required to charge the sampling capacitor to a voltage level of the input signal can be longer than the sample phase. Hence, the sampling capacitor may not be charged to the voltage level of the input signal during the sample phase, which can cause the sampling capacitor to provide an incorrect measure of the input signal to the ADC. The input channels corresponding to such input signals are referred to as "weak input channels."

One way to overcome the weak channel problem is to use a pre-sampling circuit that samples the input signal before the sample phase. The pre-sampling circuit is connected to an electrode of the sampling capacitor, and pre-samples the input signal and then outputs the pre-sampled input signal during the sample phase. The sampler circuit samples the input signal after the pre-sampling and provides the sampled input signal to the sampling capacitor. Pre-sampling of the input signal allows the sampling capacitor sufficient time to provide a correct measure of the input signal.

However, the input and sampling switches are implemented using transistors and when such transistors are closed (ON), a channel region of the transistor injects charge into the source and drain regions (known as charge injection). This charge injection is propagated to the sampling capacitor, which can introduce an error in the input signal sampled by the sampling capacitor, and consequently the sampling capacitor may provide an incorrect measure of the input signal to the ADC.

Further, during the sample phase, the charge is transferred from the sampling capacitor to the input switches. Such charge transfer, referred to as "charge sharing", may reduce the charge stored in the sampling capacitor, such that the sampling capacitor may provide an incorrect measure of the input signals to the ADC.

It would be advantageous to have a sampling circuit that pre-samples the input signals and reduces the effects of charge sharing and charge injection.

BRIEF DESCRIPTION OF THE DRAWINGS

The following detailed description of the preferred embodiments of the present invention will be better understood when read in conjunction with the appended drawings. The present invention is illustrated by way of example, and not limited by the accompanying figures, in which like references indicate similar elements.

DETAILED DESCRIPTION

Figure 1:
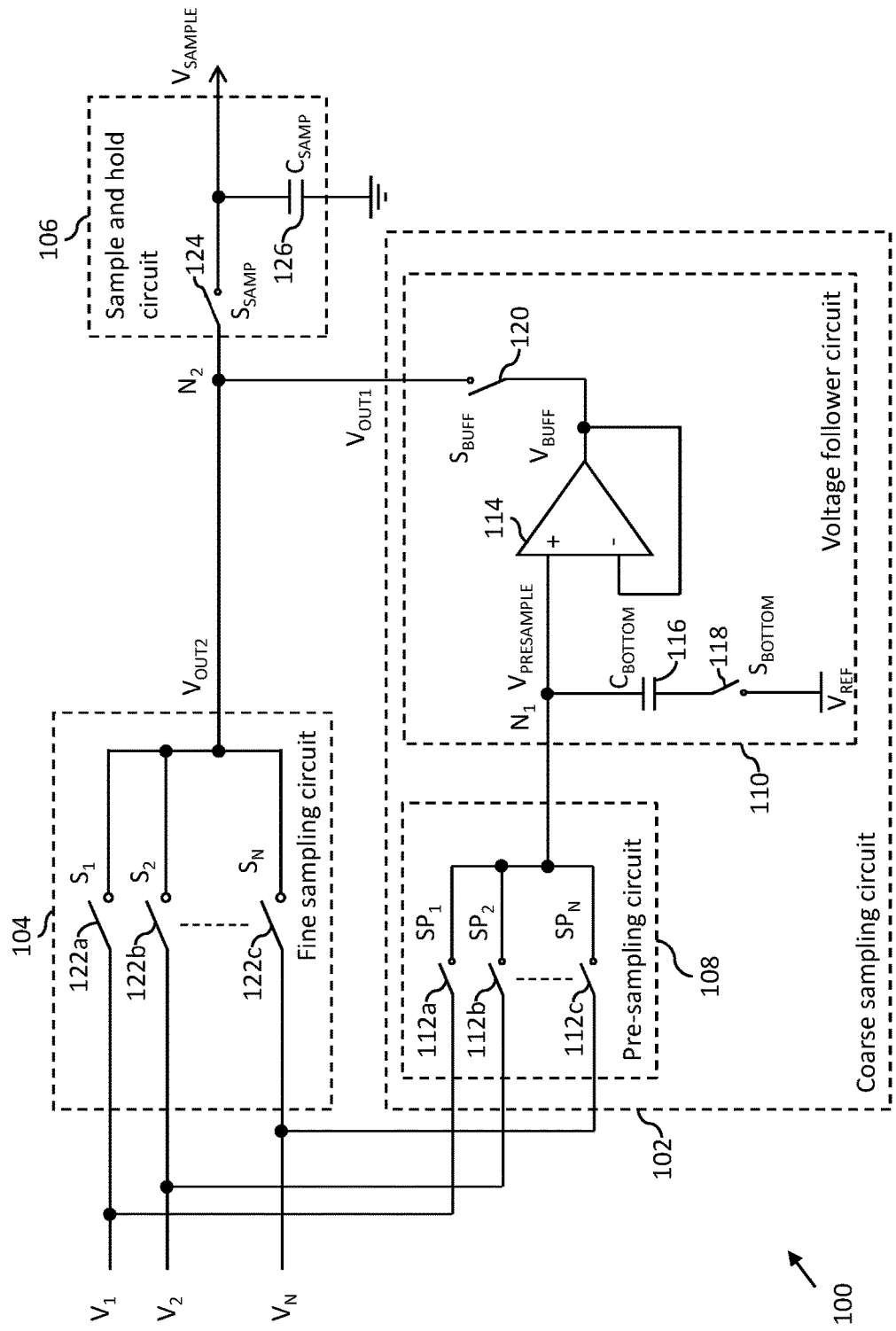
FIG. 1 is a schematic circuit diagram of a system for sampling input signals in accordance with an embodiment of the present invention.

The detailed description of the appended drawings is intended as a description of the currently preferred embodiments of the present invention, and is not intended to represent the only form in which the present invention may be practiced. It is to be understood that the same or equivalent functions may be accomplished by different embodiments that are intended to be encompassed within the spirit and scope of the present invention.

In one embodiment, the present invention is a pre-charge buffer for sampling input signals and generating a sampled output signal. The pre-charge buffer includes coarse and fine sampling circuits and a sample and hold circuit. The coarse sampling circuit includes a pre-sampling circuit and a voltage follower circuit. The coarse sampling circuit receives the input signals including a first input signal and generates a first output signal. The pre-sampling circuit receives the input signals and generates a pre-sample signal. The pre-sampling circuit samples the first input signal during a first phase, which is a hold phase of a first sample and hold cycle. The pre-sampling circuit outputs the first input signal as the pre-sample signal during the first phase and for a first predefined time interval during a second phase, which is a sample phase of a second sample and hold cycle, where the second phase comes after the first phase. The voltage follower circuit receives the pre-sample signal and generates the first output signal during the first phase and for a second predefined time interval during the second phase. Thus, the first input signal is pre-sampled in the first sample and hold cycle. The fine sampling circuit receives the input signals and generates a second output signal. The fine sampling circuit samples the first input signal during the second phase, and outputs the first input signal as the second output signal during the second phase. The sample and hold circuit receives the first output signal during the first phase and for the second predefined time interval during the second phase. The sample and hold circuit also receives the second output signal during the second phase, and generates the sampled output signal based on the first and second output signals during the second sample and hold cycle.

In another embodiment, the present invention is a pre-charge buffer for sampling input signals and generating a sampled output signal. The pre-charge buffer includes coarse and fine sampling circuits and a sample and hold circuit. The coarse sampling circuit includes a pre-sampling circuit and a voltage follower circuit. The coarse sampling circuit receives the input signals including a first input signal and generates a first output signal. The pre-sampling circuit receives the input signals and generates a pre-sample signal. The pre-sampling circuit includes a pre-sampling switch that receives the first input signal and outputs the first input signal as the pre-sample signal during a first phase and for a first predefined time interval during a second phase. The first phase is a hold phase of a first sample and hold cycle and the second phase is a sample phase of a second sample and hold cycle, where the second phase comes after the first phase. The voltage follower circuit receives the pre-sample signal and generates the first output signal during the first phase and for a second predefined time interval during the second phase. The voltage follower circuit also includes a bottom plate capacitor connected in series with a bottom plate switch. The series combination of the bottom plate capacitor and the bottom plate switch is connected between a reference voltage and the pre-sampling circuit. The bottom plate switch is in an open position for the first predefined time interval during the second phase, and in a closed position during the first phase and for a third predefined time interval during the second phase. When the bottom plate switch is closed, the bottom plate capacitor receives the pre-sample signal and is charged to a potential of the pre-sample signal. The first input signal is pre-sampled during the first sample and hold cycle. The fine sampling circuit receives the input signals and generates a second output signal. The fine sampling circuit includes a first input switch that receives the first input signal and provides the first input signal as the second output signal during the second phase. The sample and hold circuit receives the first output signal during the first phase and for the second predefined time interval during the second phase, and the second output signal during the second phase. The sample and hold circuit generates the sampled output signal during the second phase based on the first and second output signals.

Various embodiments of the present invention provide a pre-charge buffer for sampling input signals and providing a sampled output signal. The pre-charge buffer includes a coarse sampling circuit, a fine sampling circuit, and a sample and hold circuit. The coarse sampling circuit includes a pre-sampling circuit and a voltage follower circuit. The pre-sampling circuit includes a pre-sampling switch that samples a first input signal. The pre-sampling circuit provides the first input signal as a pre-sample signal during a first phase and for a first predefined time interval during a second phase. The first phase is a hold phase of a first sample and hold cycle, and the second phase is a sample phase of a second sample and hold cycle. The voltage follower circuit includes a buffer amplifier that receives the pre-sample signal and generates a buffer signal. The voltage follower circuit also includes a buffer switch that provides the buffer signal as a first output signal during the first phase and for a second predefined time interval during the second phase. The voltage follower circuit further includes a bottom plate capacitor connected in series with a bottom plate switch. The series combination of the bottom plate capacitor and the bottom plate switch is connected between a reference voltage and the buffer amplifier. The bottom plate switch disconnects the bottom plate capacitor from the reference voltage for the first predefined time interval during the second phase and connects the bottom plate capacitor to the reference voltage for a third predefined time interval during the second phase. The fine sampling circuit receives the input signals and generates a second output signal. The fine sampling circuit includes a first input switch that samples the first input signal during the second phase. The first input switch provides the first input signal as the second output signal during the second phase. The sample and hold circuit includes a sampling capacitor that samples the first and second output signals. The sampling capacitor samples the first output signal for the second predefined time interval in the second phase and the second output signal for the third predefined time interval in the second phase. The sampling capacitor stores a voltage corresponding to the first and second output signals, and generates the sampled output signal.

When the time required for charging the sampling capacitor to a voltage level of the input signal is greater than a sample phase of a sample and hold cycle, the coarse sampling circuit pre-samples the input signal during a hold phase of a previous sample and hold cycle. The fine sampling circuit samples the input signal during the sample phase. Thus, the sampling capacitor is charged to the voltage level of the input signal and provides a correct measure of the input signals.

In one embodiment, and as discussed below, the pre-sampler and input switches are implemented using transistors. Thus, errors caused by charge injection may be introduced in the sampling circuit, which results in an incorrect measure of the input signal. Therefore, to reduce the effect of the charge injection, bottom plate sampling is implemented using the bottom plate capacitor and the bottom plate switch. The bottom plate switch disconnects the bottom plate capacitor from the reference voltage during the second phase prior to opening the input switches, thereby reducing the error due to the charge injection.

Further, the coarse sampling circuit provides the first output signal to a node between the fine sampling circuit and the sample and hold circuit. The coarse sampling circuit provides the first output signal during the first phase and for the second predefined time interval during the second phase. Thus, the coarse sampling circuit compensates for charge injection errors.

Further, the charge required by the input switches of the fine sampling circuit during the second phase is provided by the coarse sampling circuit. Thus, the coarse sampling circuit reduces sharing of the charge between the sampling capacitor and the first input switch, thereby reducing the error of charge sharing due to the input switches. Thus, as will be appreciated by those of skill in the art, the pre-charge buffer is particularly beneficial when used with an ADC to compensate for weak channels.

Referring now to FIG. 1, a schematic circuit diagram of a pre-charge buffer 100 for sampling input signals in accordance with an embodiment of the present invention is shown. The pre-charge buffer 100 is used in signal processing applications such as analog-to-digital conversion. For example, the pre-charge buffer 100 is used with an ADC in automotive circuits. In such an application, the input signals are analog signals generated by analog sensors such as current mode sensors. The pre-charge buffer 100 samples the input signals and provides the sampled input signal to the ADC for further processing. The pre-charge buffer 100 includes a coarse sampling circuit 102, a fine sampling circuit 104, and a sample and hold circuit 106. The pre-charge buffer 100 samples an input signal during a sample phase of a sample and hold cycle, and holds the input signal during a hold phase of the sample and hold cycle.

The coarse sampling circuit 102 receives multiple input signals, including the first and second input signals ($V_1$ and $V_2$), and generates a first output signal ($V_{OUT1}$). The coarse sampling circuit 102 pre-samples the input signals during hold phases of corresponding sample and hold cycles. Further, the coarse sampling circuit 102 provides the pre-sampled input signals to the sample and hold circuit 106.

The coarse sampling circuit 102 includes a pre-sampling circuit 108 and a voltage follower circuit 110. The pre-sampling circuit 108 receives the input signals and generates a pre-sample signal ($V_{PRESAMPLE}$). The pre-sampling circuit 108 includes multiple pre-sampling switches 112 including first through third pre-sampling switches 112a-112c. In one embodiment, the pre-sampling switches 112 are implemented by using p-channel metal-oxide semiconductor (PMOS) transistors. In another embodiment, the pre-sampling switches 112 are implemented by using n-channel metal-oxide semiconductor (NMOS) transistors.

A first terminal of the first pre-sampling switch 112a receives the first input signal ($V_1$) and a first terminal of the second pre-sampling switch 112b receives the second input signal ($V_2$). The second pre-sampling switch 112b provides the second input signal ($V_2$) as the pre-sample signal ($V_{PRESAMPLE}$) during a first hold phase of a first sample and hold cycle (also referred to as "first phase"). The first pre-sampling switch 112a provides the first input signal ($V_1$) as the pre-sample signal ($V_{PRESAMPLE}$) during a second hold phase of a second sample and hold cycle. The second hold phase is subsequent to the first hold phase.

The voltage follower circuit 110 is connected to the pre-sampling circuit 108 to receive the pre-sample signal ($V_{PRESAMPLE}$) and generate the first output signal ($V_{OUT1}$). The voltage follower circuit 110 includes a buffer amplifier 114, a bottom plate capacitor 116, a bottom plate switch 118, and a buffer switch 120. A positive terminal of the buffer amplifier 114 is connected to second terminals of the first through third pre-sampling switches 112a-112c. A negative terminal of the buffer amplifier 114 is connected to an output terminal thereof. In a presently preferred embodiment, the buffer amplifier 114 is a unity gain amplifier that receives the pre-sample signal ($V_{PRESAMPLE}$) and generates a buffer signal ($V_{BUFF}$) during the first hold phase.

Generally, the pre-sampling switches 112 are implemented using transistors that inject unwanted charge into the sample and hold circuit 106 during the first and second sample and hold cycles. The sample and hold circuit 106 then provides an incorrect measure of the input signals to the ADC. Thus, bottom plate sampling is used in the voltage follower circuit 110 to reduce the effect of charge injection due to the pre-sampling switch 112. The bottom plate sampling is implemented by using the bottom plate capacitor 116 and the bottom plate switch 118.

A first terminal of the bottom plate capacitor 116 is connected to a first node $N_1$ formed by the interconnection of the second terminals of the first through third pre-sampling switches 112a-112c, and the positive terminal of the buffer amplifier 114. The bottom plate switch 118 is connected between a second terminal of the bottom plate capacitor 116 and a reference voltage ($V_{REF}$). In a presently preferred embodiment, the bottom plate switch 118 is implemented by using a complementary metal-oxide-semiconductor transistor (CMOS). The first terminal of the bottom plate capacitor 116 receives the pre-sample signal ($V_{PRESAMPLE}$) and is charged to a potential of the pre-sample signal ($V_{PRESAMPLE}$) when the bottom plate switch 118 is closed.

The bottom plate switch 118 is in an open position for a first predefined time interval during first and second sample phases of the first and second sample and hold cycles, respectively. The second sample phase of the second sample and hold cycle is also referred to as "second phase". The bottom plate switch 118 is closed during the first and second hold phases. The bottom plate switch 118 is open for a predefined time interval prior to the opening of the first and second pre-sampling switches 112a and 112b. This is referred to as "bottom plate sampling." Further, the use of bottom plate sampling to reduce the effect of charge injection is known well known in the art. In the presently preferred embodiment, the CMOS switch is sized for a predetermined gate to source voltage such that a minimum charge is injected due to the pre-sampling switches 112. Thus, the bottom plate switch 118 is connected to the reference voltage ($V_{REF}$) to provide the predetermined gate to source voltage. Thus, the bottom plate switch 118 reduces the effect of charge injection due to the pre-sampling switches 112.

The buffer switch 120 is connected between the buffer amplifier 114 and the sample and hold circuit 106. The buffer switch 120 is closed during the first and second hold phases and for a second predefined time interval during the first and second sample phases. The second predefined time interval is greater than the first predefined time interval. The buffer switch 120 receives the buffer signal ($V_{BUFF}$). The buffer switch 120 provides the buffer signal ($V_{BUFF}$) as the first output signal ($V_{OUT1}$) during the first and second hold phases and for the second predefined time interval during the first and second sample phases.

The fine sampling circuit 104 is connected to the coarse sampling circuit 102. The fine sampling circuit 104 receives multiple input signals and generates a second output signal ($V_{OUT2}$). The fine sampling circuit 104 includes multiple input switches 122 including first through third input switches 122a-122c. In one embodiment, the input switches 122 are implemented by using p-channel metal-oxide semiconductor (PMOS) transistors. In another embodiment, the input switches 122 are implemented by using n-channel metal-oxide semiconductor (NMOS) transistors.

A first terminal of the first input switch 122a receives the first input signal ($V_1$) and provides the first input signal ($V_1$) as the second output signal ($V_{OUT2}$) during the first sample phase. A first terminal of the second input switch 122b receives the second input signal ($V_2$) and provides the second input signal ($V_2$) as the second output signal ($V_{OUT2}$) during the second sample phase.

The sample and hold circuit 106 is connected to a second node $N_2$ formed by an interconnection of the coarse and fine sampling circuits 102 and 104. The sample and hold circuit 106 receives the first and second output signals ($V_{OUT1}$ and $V_{OUT2}$), respectively, and generates a sampled output signal ($V_{SAMPLE}$). The sample and hold circuit 106 includes a sampling switch 124 and a sampling capacitor 126. The sampling switch 124 provides the first and second output signals ($V_{OUT1}$ and $V_{OUT2}$) to the sampling capacitor 126 during both the first and second sample phases. The sampling capacitor 126 is connected to the sampling switch 124 to receive the first and second output signals ($V_{OUT1}$ and $V_{OUT2}$), and generate a sampled output signal ($V_{SAMPLE}$).

Figure 2:
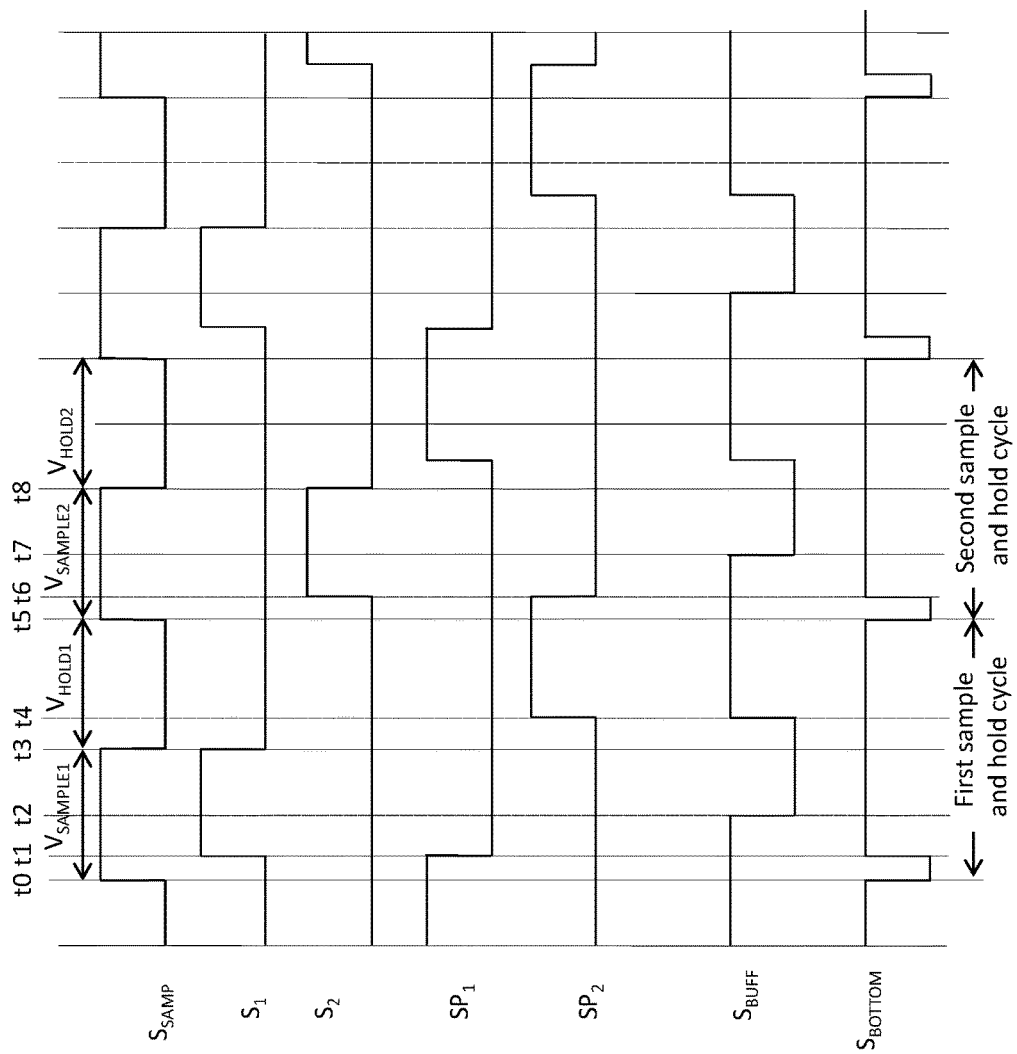
FIG. 2 is a timing diagram illustrating relative switching times of switches used in the system of FIG. 1.

FIG. 2 is a timing diagram that illustrates the operation of the pre-charge buffer 100 during the first and second sample and hold cycles. FIG. 2 shows the first and second sample and hold cycles and the relative switching times of the first and second input switches 122a and 122b, the second pre-sampling switch 112b, the bottom plate switch 118, and the buffer switch 120.

The time interval t0-t3 represents the first sample phase. At power on of the pre-charge buffer 100, at time to, the fine sampling circuit 104 receives the first and second input signals ($V_1$ and $V_2$). The first sample phase begins when the sampling switch 124 is closed at time t0. The first input switch 122a is closed at time t1. When the first input switch 122a is closed, the fine sampling circuit 104 outputs the first input signal ($V_1$) as the second output signal ($V_{OUT2}$). Further, at time t1 the sampling switch 124 provides the first input signal ($V_1$) to the sampling capacitor 126. Thus, the sampling capacitor 126 begins the sampling of the first input signal ($V_1$) during the first sample phase. At time t2, the buffer switch 120 is opened to disconnect the coarse sampling circuit 102 from the sample and hold circuit 106. The sampling switch 124 and the first input switch 122a are opened at time t3. During time t1-t3, the sampling capacitor 126 is charged to a voltage level of the first input signal ($V_1$). Thus, the sample and hold circuit 106 samples the first input signal ($V_1$) during the first sample phase.

The time interval t3-t5 represents the first hold phase. The first and second input switches 122a and 122b and the sampling switch 124 are opened at time t3. During time interval t3-t5, the sampling capacitor 126 holds the first input signal ($V_1$) and provides the first input signal ($V_1$) as the sampled output signal ($V_{SAMPLE}$). At time t4, the second pre-sampling switch 112b and the buffer switch 120 are closed. The second pre-sampling switch 112b receives the second input signal ($V_2$) and provides the second input signal ($V_2$) as the pre-sample signal ($V_{PRESAMPLE}$). The voltage follower circuit 110 receives the second input signal ($V_2$) and generates the buffer signal ($V_{BUFF}$). The buffer switch 120 provides the buffer signal ($V_{BUFF}$) as the first output signal ($V_{OUT1}$) and charges the second node $N_2$ to a voltage level of the second input signal ($V_2$). Thus, the coarse sampling circuit 102 pre-samples the second input signal ($V_2$) during the first hold phase.

The time interval t5-t8 represents the second sample phase. At time t5, the sampling switch 124 is closed. The sampling switch 124 receives the pre-sampled second input signal ($V_2$) from the second node $N_2$ and provides the pre-sampled second input signal ($V_2$) to the sampling capacitor 126. The sampling capacitor 126 is charged to a voltage level that is approximately equal to the voltage level of the second input signal ($V_2$), thereby coarse sampling the second input signal ($V_2$). At time t6, the second input switch 122b is closed. The second input switch 122b provides the second input signal ($V_2$) as the second output signal ($V_{OUT2}$) to the sampling capacitor 126. Since the sampling switch 124 is in a closed position at time t6, the sampling capacitor 126 receives the second input signal ($V_2$), thereby fine sampling the second input signal ($V_2$). Thus, the sampling capacitor 126 receives the pre-sampled second input signal ($V_2$) and the fine-sampled second input signal ($V_2$), and generates the sampled output signal ($V_{SAMPLE}$).

For example, if the second input signal ($V_2$) has a voltage level of 5V, then during the first hold phase, the coarse sampling circuit 102 charges the node $N_2$ to 4.95V. At time t5, the sampling capacitor 126 receives 4.95V from the node $N_2$ and is charged to the voltage level of 4.95V during t5-t6. At time t6, the sampling capacitor 126 receives the second input signal ($V_2$) at the voltage level of 5V. Thus, the difference of 0.05V is provided by the second input signal ($V_2$). Similarly, the coarse sampling circuit 102 pre-samples the first input signal ($V_1$) during the second hold phase, and the fine sampling circuit 104 fine-samples the first input signal ($V_1$) during the next sample phase. Thus, when the input signals correspond to weak input channels, the coarse sampling circuit 102 pre-samples the input signals before they are sampled by the fine sampling circuit 104.

The bottom plate switch 118 is opened at time t0 and closed at time t1 during the first sample phase. Similarly, the bottom plate switch 118 is opened at time t5 and closed at time t6 during the second sample phase. The time intervals t0-t1 and t5-t6 are the first predefined time intervals. Further, the bottom plate switch 118 is closed during time intervals t1-t3 t6-t8, and also during the first and second hold phases. The time intervals t1-t3 and t6-t8 are a third predefined time interval. The third predefined time interval is greater than the first and second predefined time intervals. Thus, the bottom plate switch 118 is opened for a predefined time before opening the pre-sampling switches 112. Such a switching sequence of the bottom plate switch 118 is used to reduce the effect of charge injection due to the pre-sampling switches 112.

To reduce the effect of the charge injection due to the input switches 122, the buffer switch 120 is held in the closed position for time intervals t0-t2 and t5-t7. The time intervals t0-t2 and t5-t7 are the second predefined time interval. The third predefined time interval is greater than the first and second predefined time intervals, and the second predefined time interval is greater than the first predefined time interval. Thus, the voltage follower circuit 110 provides the first and second input signals ($V_1$ and $V_2$) as the first output signal ($V_{OUT1}$) to the sampling capacitor 126 to compensate an error due to the charge injection by the input switches 122.

When the first input switch 122a and the sampling switch 124 are closed, the charge stored by the sampling capacitor 126 corresponding to the first input signal ($V_1$) is transferred to the first input switch 122a. Similarly, when the second input switch 122b and the sampling switch 124 are closed, the charge stored by the sampling capacitor 126 corresponding to the second input signal ($V_2$) is transferred to the second input switch 122b. The transfer of charge from the sampling capacitor 126 to the input switches 122 (i.e., charge sharing) reduces the charge stored in the sampling capacitor 126 such that it could generate an incorrect measure of the sampled output signal ($V_{SAMPLE}$) and provide an incorrect measure of the input signals to the ADC. However, the coarse sampling circuit 102 provides the second output signal ($V_{OUT2}$) for the first pre-defined time interval t5-t6 to the input switches 122 before the sampling switch 124 is closed. Thus, the coarse sampling circuit 102 provides the charge required by the channel regions of the corresponding input switches 122, thereby reducing the effect of charge sharing between the input switches 122 and the sampling capacitor 126. Thus, the pre-charge buffer 100 pre-samples the input signals, and reduces the effect of charge sharing and charge injection.

It will be understood by those with skill in the art that the invention is not restricted to the use of only two pre-sampling switches and two input switches in the coarse and fine sampling circuits 102 and 104, respectively. The coarse and fine sampling circuits 102 and 104 may include a large number of pre-sampler and input switches, respectively, in the form of an array of input and pre-sampling switches. The array of pre-sampling switches is connected to the corresponding array of the input switches.

While various embodiments of the present invention have been illustrated and described, it will be clear that the present invention is not limited to these embodiments only. Numerous modifications, changes, variations, substitutions, and equivalents will be apparent to those skilled in the art, without departing from the spirit and scope of the present invention, as described in the claims.

The invention claimed is:

1. A pre-charge buffer for sampling a plurality of input signals and providing a sampled output signal, comprising:
   a coarse sampling circuit that receives the plurality of input signals including a first input signal and generates a first output signal, comprising:
      a pre-sampling circuit that receives the plurality of input signals and generates a pre-sample signal, wherein (a) the pre-sampling circuit samples the first input signal during a first phase of a first sample and hold cycle, (b) the first phase is a hold phase of the first sample and hold cycle, (c) the pre-sampling circuit outputs the first input signal as the pre-sample signal during the first phase and for a first predefined time interval during a second phase of a second sample and hold cycle, (d) the second phase is a sample phase of the second sample and hold cycle, and (e) the second phase occurs after the first phase, such that the first input signal is pre-sampled in the first sample and hold cycle; and
      a voltage follower circuit, connected to the pre-sampling circuit, that receives the pre-sample signal and generates the first output signal during the first phase and for a second predefined time interval during the second phase;
   a fine sampling circuit, connected to the coarse sampling circuit, that receives the plurality of input signals and generates a second output signal, wherein the fine sampling circuit samples the first input signal during the second phase, and outputs the first input signal as the second output signal during the second phase; and
   a sample and hold circuit, connected to the coarse and fine sampling circuits, that receives the first output signal during the first phase and for the second predefined time interval during the second phase, and receives the second output signal during the second phase, and generates the sampled output signal during the second sample and hold cycle based on the first and second output signals.

2. The pre-charge buffer of claim 1, wherein:
   the fine sampling circuit includes a first input switch having a first terminal for receiving the first input signal, and
   the first input switch provides the first input signal as the second output signal during the second phase.

3. The pre-charge buffer of claim 2, wherein the pre-sampling circuit includes a pre-sampling switch having a first terminal connected to the first terminal of the first input switch, and wherein the pre-sampling switch provides the first input signal as the pre-sample signal during the first phase and for the first predefined time interval during the second phase.

4. The pre-charge buffer of claim 3, wherein the voltage follower circuit comprises:
   a buffer amplifier, connected to a second terminal of the pre-sampling switch, that receives the pre-sample signal and generates a buffer signal, wherein the buffer amplifier is connected to the fine sampling circuit and the sample and hold circuit by way of a buffer switch, and wherein the buffer switch provides the buffer signal as the first output signal;
   a bottom plate capacitor having a first terminal connected to the second terminal of the pre-sampling switch for receiving the pre-sample signal, wherein the first terminal of the bottom plate capacitor is charged to a potential of the pre-sample signal during the first phase; and
   a bottom plate switch, connected between a second terminal of the bottom plate capacitor and a reference voltage, wherein the bottom plate switch is in an open position for the first predefined time interval during the second phase, and in a closed position during the first phase and for a third predefined time interval during the second phase.

5. The pre-charge buffer of claim 4, wherein the third predefined time interval is greater than the first and second predefined time intervals, and the second predefined time interval is greater than the first predefined time interval.

6. The pre-charge buffer of claim 4, wherein the buffer amplifier is a unity gain amplifier.

7. The pre-charge buffer of claim 4, wherein the buffer switch is in a closed position during the first phase and for the second predefined time interval during the second phase.

8. The pre-charge buffer of claim 2, wherein the sample and hold circuit comprises:
   a sampling switch having a first terminal connected to the coarse and fine sampling circuits for receiving the first and second output signals, respectively, wherein the sampling switch is in an open position during the first phase, and in a closed position during the second phase; and
   a sampling capacitor, connected to a second terminal of the sampling switch, that samples the first and second output signals during the second phase and generates the sampled output signal based on the first and second output signals.

9. A pre-charge buffer for sampling a plurality of input signals and providing a sampled output signal, comprising:
   a coarse sampling circuit that receives the plurality of input signals including a first input signal and generates a first output signal, the coarse sampling circuit comprising:
      a pre-sampling circuit that receives the plurality of input signals and generates a pre-sample signal, comprising:
         a pre-sampling switch having a first terminal that receives the first input signal and outputs the first input signal as the pre-sample signal during a first phase and for a first predefined time interval during a second phase, wherein the first phase is a hold phase of a first sample and hold cycle and the second phase is a sample phase of a second sample and hold cycle, and wherein the second phase is subsequent to the first phase, whereby the first input signal is pre-sampled in the first sample and hold cycle;
         a voltage follower circuit, connected to a second terminal of the pre-sampling switch, that receives the pre-sample signal and generates the first output signal during the first phase and for a second predefined time interval during the second phase, and wherein the voltage follower circuit comprises:
            a buffer amplifier connected to the second terminal of the pre-sampling switch, that receives the pre-sample signal and generates a buffer signal, wherein the buffer amplifier provides the buffer signal as the first output signal by way of a buffer switch;
            a bottom plate capacitor having a first terminal connected to the second terminal of the pre-sampling switch for receiving the pre-sample signal, wherein the first terminal of the bottom plate capacitor is charged to a potential of the pre-sample signal during the first phase; and a bottom plate switch, connected between a second terminal of the bottom plate capacitor and a reference voltage, wherein the bottom plate switch is in an open position for the first predefined time interval during the second phase, and in a closed position during the first phase and for a third predefined time interval during the second phase; and a fine sampling circuit, connected to the coarse sampling circuit, that receives the plurality of input signals and generates a second output signal, the fine sampling circuit comprising:

a first input switch having a first terminal connected to the first terminal of the pre-sampling switch for receiving the first input signal, wherein the first input switch outputs the first input signal as the second output signal when the first input switch is in a closed position, and outputs the first input signal as the second output signal during the second phase; and a sample and hold circuit, connected to the fine sampling circuit and the voltage follower circuit, that receives the first output signal during the first phase and for the second predefined time interval during the second phase, and receives the second output signal during the second phase, and generates the sampled output signal during the second sample and hold cycle based on the first and second output signals.

10. The pre-charge buffer of claim 9, wherein the sample and hold circuit comprises:

a sampling switch having a first terminal connected to the coarse and fine sampling circuits for receiving the first and second output signals, respectively, wherein the sampling switch is in an open position during the first phase, and in a closed position during the second phase; and a sampling capacitor, connected to a second terminal of the sampling switch, that samples the first and second output signals during the second phase, and generates the sampled output signal based on the first and second output signals.

11. The pre-charge buffer of claim 9, wherein the third predefined time interval is greater than the first and second predefined time intervals, and the second predefined time interval is greater than the first predefined time interval.

12. The pre-charge buffer of claim 9, wherein the buffer amplifier is a unity gain amplifier.

13. The pre-charge buffer of claim 9, wherein the buffer switch is connected between the voltage follower circuit and the sample and hold circuit, and wherein the buffer switch is in a closed position during the first phase and for the second predefined time interval during the second phase.

\* \* \* \* \*